(12) United States Patent
Hill et al.

(10) Patent No.: US 11,531,275 B1
(45) Date of Patent: Dec. 20, 2022

(54) PARALLEL SCATTEROMETRY OVERLAY METROLOGY

(71) Applicant: KLA Corporation, Milpitas, CA (US)

(72) Inventors: Andrew V. Hill, Berkeley, CA (US); Amnon Manassen, Haifa (IL); Dmitry Gorelik, Migdal Ha'emek (IL)

(73) Assignee: KLa Corporation, Milpitas, CA (US)

(*) Notice: Subject to any disclaimer, the term of this patent is extended or adjusted under 35 U.S.C. 154(b) by 0 days.

(21) Appl. No.: 17/411,539

(22) Filed: Aug. 25, 2021

(51) Int. Cl.
*G03F 7/20* (2006.01)
*G01B 11/27* (2006.01)

(52) U.S. Cl.
CPC ........ *G03F 7/70633* (2013.01); *G01B 11/272* (2013.01); *G03F 7/70491* (2013.01)

(58) Field of Classification Search
CPC ............. G03F 7/70633; G03F 7/70491; G03F 9/7088; G01B 11/272
See application file for complete search history.

(56) References Cited

U.S. PATENT DOCUMENTS

| | | | |
|---|---|---|---|
| 7,349,105 B2 | 3/2008 | Weiss | |
| 7,440,105 B2 | 10/2008 | Adel et al. | |
| 9,182,219 B1 | 11/2015 | Manassen et al. | |
| 10,371,626 B2 | 8/2019 | Hill et al. | |
| 10,551,749 B2 | 2/2020 | Levinski et al. | |
| 11,073,768 B2 | 7/2021 | Hill et al. | |
| 2020/0124408 A1 | 4/2020 | Hill et al. | |
| 2021/0072650 A1 | 3/2021 | Feler et al. | |
| 2021/0247601 A1 | 8/2021 | Hill et al. | |
| 2021/0318627 A1* | 10/2021 | Elazhary | G03F 9/7088 |
| 2022/0034652 A1* | 2/2022 | Manassen | G01B 9/02027 |
| 2022/0214285 A1* | 7/2022 | Hill | G01N 21/47 |

OTHER PUBLICATIONS

U.S. Appl. No. 16/931,078, filed Jul. 16, 2020, Volkovich et al.
U.S. Appl. No. 16/935,117, filed Jul. 21, 2020, Feler et al.

* cited by examiner

*Primary Examiner* — Peter B Kim
(74) *Attorney, Agent, or Firm* — Suiter Swantz pc llo

(57) ABSTRACT

An overlay metrology tool may include an illumination source to generate a first illumination beam distribution with a first linear polarization and a second illumination beam distribution with a second linear polarization orthogonal to the first linear polarization, an illumination sub-system to sequentially illuminate two or more cell pairs of an overlay target on a sample having orthogonally oriented grating-over-grating structures, a collection sub-system with two collection channels to capture collected light from an illuminated cell pair and filtering optics to direct light from different cells in an illuminated cell pair to different collection channels for detection. The tool may further include a controller to generate separate overlay measurements for orthogonally-oriented grating-over-grating structures in the two or more cell pairs.

31 Claims, 7 Drawing Sheets

PARALLEL SCATTEROMETRY OVERLAY METROLOGY

TECHNICAL FIELD

The present disclosure is related generally to overlay metrology and, more particularly, to scatterometry-based overlay metrology.

BACKGROUND

Overlay metrology generally refers to measurements of the relative alignment of layers on a sample such as, but not limited to, semiconductor devices. An overlay measurement, or a measurement of overlay error, typically refers to a measurement of the misalignment of fabricated features on one or more sample layers. In a general sense, proper alignment of fabricated features on multiple sample layers is necessary for proper functioning of the device. Demands to decrease feature size and increase feature density are resulting in correspondingly increased demand for accurate and efficient overlay metrology. Many existing overlay measurement techniques require separate measurement steps of multiple cells of an overlay target to generate overlay data for a particular direction and further require additional sets of measurement steps to generate overlay data for additional directions. However, the time required to perform such measurement steps may provide a limitation on the throughput of an overlay metrology system. There is therefore a need to develop systems and methods to overcome these deficiencies.

SUMMARY

An overlay metrology tool is disclosed in accordance with one or more illustrative embodiments of the present disclosure. In one illustrative embodiment, the tool includes an illumination source to generate a first illumination beam distribution with a first linear polarization and a second illumination beam distribution with a second linear polarization orthogonal to the first linear polarization. In another illustrative embodiment, the tool includes an illumination sub-system to sequentially illuminate two or more cell pairs of an overlay target on a sample. A particular one of the two or more cell pairs may include a first-direction cell with a grating-over-grating structure having periodicity along a first direction and a second-direction cell with a grating-over-grating structure having periodicity along a second direction orthogonal to the first direction. In another illustrative embodiment, the illumination sub-system simultaneously illuminates the first-direction cell with a first illumination beam distribution and the second-direction cell with a second illumination beam distribution. In another illustrative embodiment, the tool includes a collection sub-system with a first collection channel including one or more first-channel detectors at a first-channel detection plane, a second collection channel including one or more second-channel detectors at a second-channel detection plane, an objective lens to collect light from the sample as collected light, and one or more filtering optics to direct portions of the collected light associated with first-direction cells of the two or more cell pairs to the first collection channel and direct portions of the collected light associated with second-direction cells of the two or more cell pairs to the second collection channel. In another illustrative embodiment, the tool includes a controller to generate a first overlay measurement along the first direction based on data associated with the first-direction cells of the two or more cell pairs from the one or more first-channel detectors, and generate a second overlay measurement along the second direction based on data associated with the second-direction cells of the two or more cell pairs from the one or more second-channel detectors.

An overlay metrology tool is disclosed in accordance with one or more illustrative embodiments of the present disclosure. In one illustrative embodiment, the tool includes an illumination source to generate a first illumination beam distribution with a first linear polarization and a second illumination beam distribution with a second linear polarization orthogonal to the first linear polarization. In another illustrative embodiment, the tool includes an illumination sub-system to sequentially illuminate two or more cell pairs of an overlay target on a sample. A particular one of the two or more cell pairs may include a first-direction cell with a grating-over-grating structure having periodicity along a first direction and a second-direction cell with a grating-over-grating structure having periodicity along a second direction orthogonal to the first direction. In another illustrative embodiment, the illumination system includes a first illumination channel to direct a first illumination beam distribution to the first-direction cell of one of the two or more cell pairs, where the first illumination beam distribution includes one or more first illumination beams with a first linear polarization. In another illustrative embodiment, the illumination sub-system further includes a second illumination channel to direct a second illumination beam distribution to the second-direction cell of one of the two or more cell pairs simultaneously with the first illumination beam distribution, where the second illumination beam distribution includes one or more second illumination beams with a first linear polarization. In another illustrative embodiment, the tool includes a collection sub-system with a first collection channel including one or more first-channel detectors at a first-channel detection plane, a second collection channel including one or more second-channel detectors at a second-channel detection plane, an objective lens to collect light from the sample as collected light, and a polarizing beamsplitter to direct portions of the collected light associated with first-direction cells having the first linear polarization to the first collection channel and direct portions of the collected light associated with second-direction cells of the two or more cell pairs having the second linear polarization to the second collection channel. In another illustrative embodiment, the tool includes a controller to generate a first overlay measurement along the first direction based on data associated with the first-direction cells of the two or more cell pairs from the one or more first-channel detectors, and generate a second overlay measurement along the second direction based on data associated with the second-direction cells of the two or more cell pairs from the one or more second-channel detectors.

An overlay metrology method is disclosed in accordance with one or more illustrative embodiments of the present disclosure. In one illustrative embodiment, the method includes generating a first illumination beam distribution with a first linear polarization and a second illumination beam distribution with a second linear polarization orthogonal to the first linear polarization. In another illustrative embodiment, the method includes sequentially illuminating two or more cell pairs of an overlay target on a sample, where each of the two or more cell pairs includes a first-direction cell with a grating-over-grating structure having periodicity along a first direction and a second-direction cell with a grating-over-grating structure having periodicity along a second direction orthogonal to the first direction, and where the illumination sub-system simultaneously illuminates the first-direction cell with a first illumination beam distribution and the second-direction cell with a second illumination beam distribution. In another illustrative embodiment, the method includes collecting light from the sample as collected light. In another illustrative embodiment, the method includes directing portions of the collected light associated with first-direction cells of the two or more cell pairs to the first collection channel. In another illustrative embodiment, the method includes directing portions of the collected light associated with second-direction cells of the two or more cell pairs to the second collection channel. In another illustrative embodiment, the method includes generating a first overlay measurement along the first direction based on data associated with the first-direction cells of the two or more cell pairs. In another illustrative embodiment, the method includes generating a second overlay measurement along the second direction based on data associated with the second-direction cells of the two or more cell pairs.

It is to be understood that both the foregoing general description and the following detailed description are exemplary and explanatory only and are not necessarily restrictive of the invention as claimed. The accompanying drawings, which are incorporated in and constitute a part of the specification, illustrate embodiments of the invention and together with the general description, serve to explain the principles of the invention.

BRIEF DESCRIPTION OF DRAWINGS

The numerous advantages of the disclosure may be better understood by those skilled in the art by reference to the accompanying figures.

DETAILED DESCRIPTION

Figure 1A:
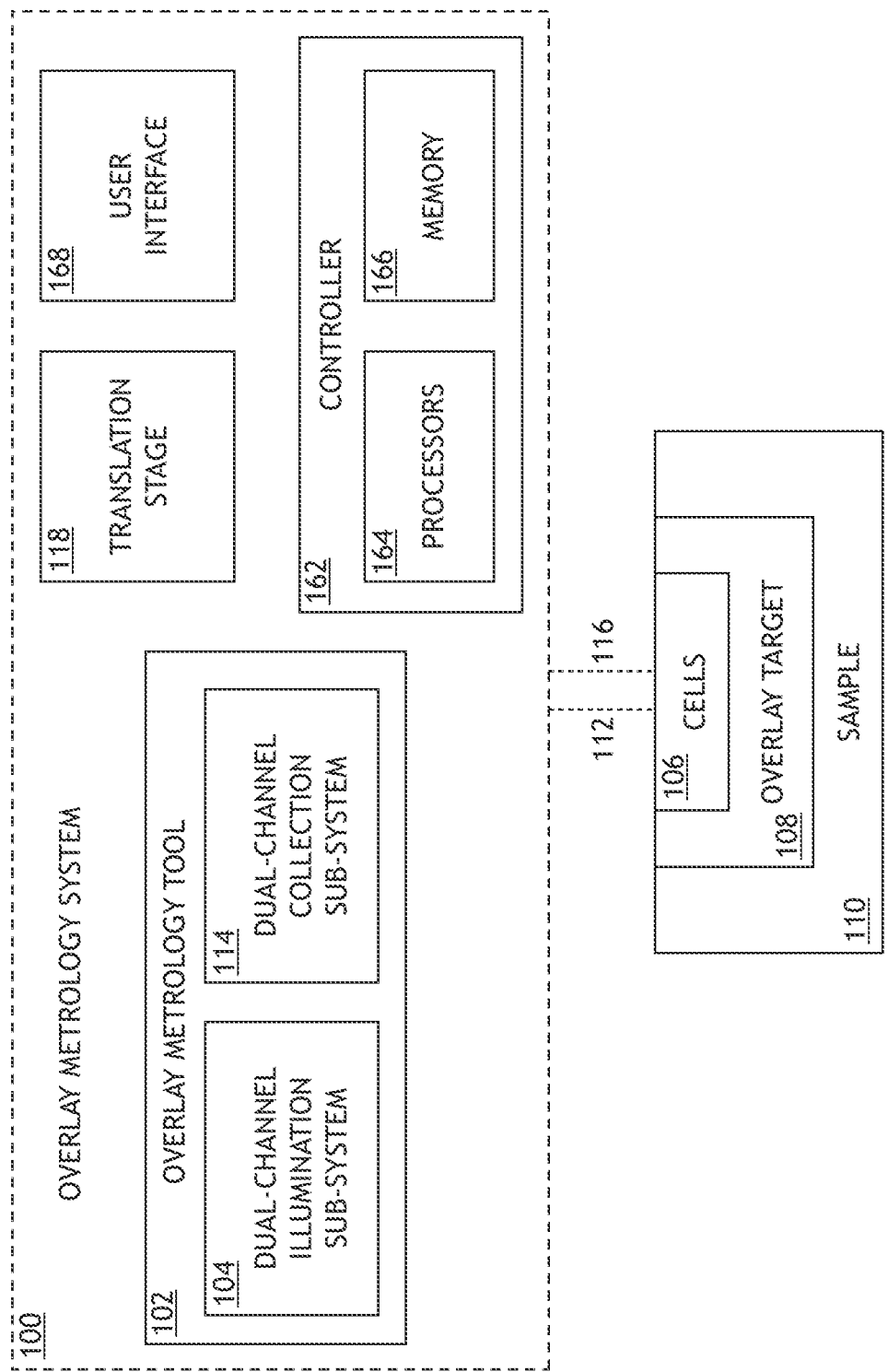
FIG. 1A is a block diagram view of an overlay metrology system, in accordance with one or more embodiments of the present disclosure.

Reference will now be made in detail to the subject matter disclosed, which is illustrated in the accompanying drawings. The present disclosure has been particularly shown and described with respect to certain embodiments and specific features thereof. The embodiments set forth herein are taken to be illustrative rather than limiting. It should be readily apparent to those of ordinary skill in the art that various changes and modifications in form and detail may be made without departing from the spirit and scope of the disclosure.

Embodiments of the present disclosure are directed to systems and methods for generating parallel measurements of cells of an overlay target using scatterometry techniques. In some embodiments, two cells of an overlay target associated with overlay measurements along two different (e.g., orthogonal) directions are simultaneously illuminated, light from the two illuminated cells is simultaneously collected, and the collected light associated with the illuminated cells is directed to separate detection paths. In this way, measurements of multiple cells of an overlay target may be performed in parallel, which may beneficially increase the measurement throughput relative to sequential measurements of each cell on the target. Additional embodiments are directed to a multi-channel scatterometry overlay tool suitable for simultaneously illuminating multiple cells of an overlay target and separating the light from the multiple cells into separate detection channels.

For the purposes of the present disclosure, the term overlay is generally used to describe relative positions of features on a sample fabricated by two or more lithographic patterning steps, where the term overlay error describes a deviation of the features from a nominal arrangement. For example, a multi-layered device may include features patterned on multiple sample layers using different lithography steps for each layer, where the alignment of features between layers must typically be tightly controlled to ensure proper performance of the resulting device. Accordingly, an overlay measurement may characterize the relative positions of features on two or more of the sample layers. By way of another example, multiple lithography steps may be used to fabricate features on a single sample layer. Such techniques, commonly called double-patterning or multiple-patterning techniques, may facilitate the fabrication of highly dense features near the resolution of the lithography system. An overlay measurement in this context may characterize the relative positions of the features from the different lithography steps on this single layer. It is to be understood that examples and illustrations throughout the present disclosure relating to a particular application of overlay metrology are provided for illustrative purposes only and should not be interpreted as limiting the disclosure.

While in some applications overlay measurements may be performed directly on features of a fabricated device (e.g., device features), overlay measurements are commonly performed on dedicated overlay targets printed using the same lithography steps as the device features. In this way, the features of an overlay target (e.g., target features) may be specially designed to facilitate overlay measurements. Further, overlay measured at one fabrication step (e.g., after the fabrication of one or more sample layers) may be used to generate correctables for precisely aligning a process tool (e.g., a lithography tool, or the like) for the fabrication of an additional sample layer in a subsequent fabrication step.

In some embodiments, an overlay target suitable for scatterometry metrology as disclosed herein may include one or more cells having a grating-over-grating structure, where a grating-over-grating structure includes periodic features (e.g., grating features) on overlapping regions of two or more layers of interest. In this way, the various grating features on the layers of interest may contribute to the diffraction of incident illumination and an overlay measurement may be generated based on analysis of the diffracted light. For example, an overlay measurement may be generated based on pupil-plane data (e.g., associated with relative intensity differences between selected diffraction orders in a pupil plane). By way of another example, an overlay measurement may be generated based on field-plane data (e.g., associated with relative intensities of images of cells of the target generated with selected diffraction orders).

As used throughout the present disclosure, the term "sample" generally refers to a substrate formed of a semiconductor or non-semiconductor material (e.g., a wafer, or the like). For example, a semiconductor or non-semiconductor material may include, but is not limited to, monocrystalline silicon, gallium arsenide, and indium phosphide. A sample may include one or more layers. For example, such layers may include, but are not limited to, a resist, a dielectric material, a conductive material, and a semiconductive material. Many different types of such layers are known in the art, and the term sample as used herein is intended to encompass a sample on which all types of such layers may be formed. One or more layers formed on a sample may be patterned or unpatterned. For example, a sample may include a plurality of dies, each having repeatable patterned features. Formation and processing of such layers of material may ultimately result in completed devices. Many different types of devices may be formed on a sample, and the term sample as used herein is intended to encompass a sample on which any type of device known in the art is being fabricated. Further, for the purposes of the present disclosure, the term sample and wafer should be interpreted as interchangeable. In addition, for the purposes of the present disclosure, the terms patterning device, mask, and reticle should be interpreted as interchangeable.

In some embodiments, an overlay metrology tool simultaneously illuminates two cells of an overlay target with two illumination beams, where the two cells include grating-over-grating structures in which the orientations of the gratings in one cell are orthogonal to the orientations of the gratings in the other cell. For example, the overlay metrology tool may simultaneously illuminate an X-direction cell including a grating-over-grating structure having periodicity along an X direction with a first illumination beam and illuminate a Y-direction cell including a grating-over-grating structure having periodicity along a Y direction with a second illumination beam. It is to be understood that descriptions of X and Y directions are used herein solely for illustrative purposes to refer to arbitrary orthogonal directions on a sample. Further, the two cells may be illuminated with light having orthogonal linear polarizations (e.g., one cell is illuminated with linearly polarized light along the X direction and one cell is illuminated with linearly polarized light along the Y direction). In particular, the overlay metrology tool may illuminate each of the two cells with a distribution of one or more illumination beams (e.g., an illumination beam distribution), where the illumination beam distribution on each cell is smaller than the cell such that the cell is underfilled. Additionally, various aspects of the illuminating light on each cell such as, but not limited to, the spectrum (e.g., spectral bandwidth and/or center wavelength), intensity, illumination angle, an angular distribution of illumination, or focal position may be individually controlled or adjusted.

In some embodiments, an overlay metrology tool simultaneously separates collected light from the illuminated cells into separate detection channels for each cell. In this way, measurement data associated with the illuminated cells may be isolated from each other despite the simultaneous collection. A variety of techniques for separating the collected light into separate detection channels may be used within the spirit and scope of the present disclosure. For example, the collected light from the illuminated cells may be separated based on parameters such as, but not limited to, polarization, pupil-stop filters (e.g., spatial filters in a pupil plane to pass selected diffraction orders), or field-stop filters (e.g., spatial filters in a field plane to pass light from a selected cell).

In some embodiments, an overlay metrology tool includes beam control optics in illumination and/or collection paths to control various aspects of the illumination light or collected light. For example, the overlay metrology tool may include one or more scan mirrors to scan the illumination beams across the respective cells during a measurement, which may reduce noise associated with target imperfections. By way of another example, the overlay metrology tool may include beam control optics to control or adjust the separation between the two illumination beams, which may be used to match the illumination beam separation to the layout of the cells in a particular overlay target. Further, the overlay metrology tool may adjust illumination and/or collection field stops based on a selected illumination beam separation.

Additional embodiments of the present disclosure are directed to overlay targets suitable for parallel measurements by an overlay metrology tool. In some embodiments, an overlay target includes X-direction cells distributed along a first row and Y-direction cells distributed along a second row. In this way, cells associated with a particular direction may be illuminated sequentially with the same or similar illumination conditions (e.g., polarization, spectrum, intensity, angular distribution of illumination, focal position of the sample during illumination, or the like) simply by scanning the overlay target along the rows. For example, some overlay measurement techniques may require data capture from multiple cells with different intended offsets of the grating-over-grating structures. Accordingly, arranging the cells with common directions of periodicity along rows may reduce the burden on the overlay metrology tool such that illumination conditions may be the same or substantially the same as the target is scanned along the row direction.

Referring now to FIGS. 1A-4, systems and methods for generating parallel measurements of cells of an overlay target using scatterometry techniques.

FIG. 1A is a block diagram view of an overlay metrology system 100, in accordance with one or more embodiments of the present disclosure.

In some embodiments, the overlay metrology system 100 includes an overlay metrology tool 102 with a dual-channel illumination sub-system 104 to separately illuminate two cells 106 of an overlay target 108 on a sample 110 with spatially-separated distributions of one or more illumination beams 112 (e.g., illumination beam distributions) having orthogonal linear polarizations and a dual-channel collection sub-system 114 to separately detect light or other radiation emanating from the sample 110 (e.g., collected light 116) associated with the two cells 106.

In some embodiments, the sample 110 is disposed on a sample stage 118 suitable for securing the sample 110 and further configured to position the sample 110 with respect to the overlay metrology tool 102. For example, the sample stage 118 may include any combination of linear, rotational, or angular (e.g., tip/tilt) actuators suitable for positioning the sample 110 in any selected orientation.

The overlay metrology tool 102 may be any type of overlay metrology tool known in the art suitable for generating overlay signals suitable for determining overlay associated with overlay targets on a sample 110. For example, the overlay metrology tool 102 may collect pupil-plane data (e.g., one or more pupil-plane images or portions thereof) in which collected light 116 is analyzed at a pupil plane to characterize an angular distribution of radiation from the cells 106 (e.g., associated with scattering and/or diffraction of radiation by the cells 106). By way of another example, the overlay metrology tool 102 may collect field-plane data (e.g., one or more field-plane images or portions thereof) based on selected diffraction orders from the cells 106. Additionally, the overlay metrology tool 102 may characterize the cells 106 while the sample 110 is static (e.g., in a static or move-and-measure (MAM) mode) or while the sample 110 is in motion (e.g., in a scanning mode).

Figure 2A:
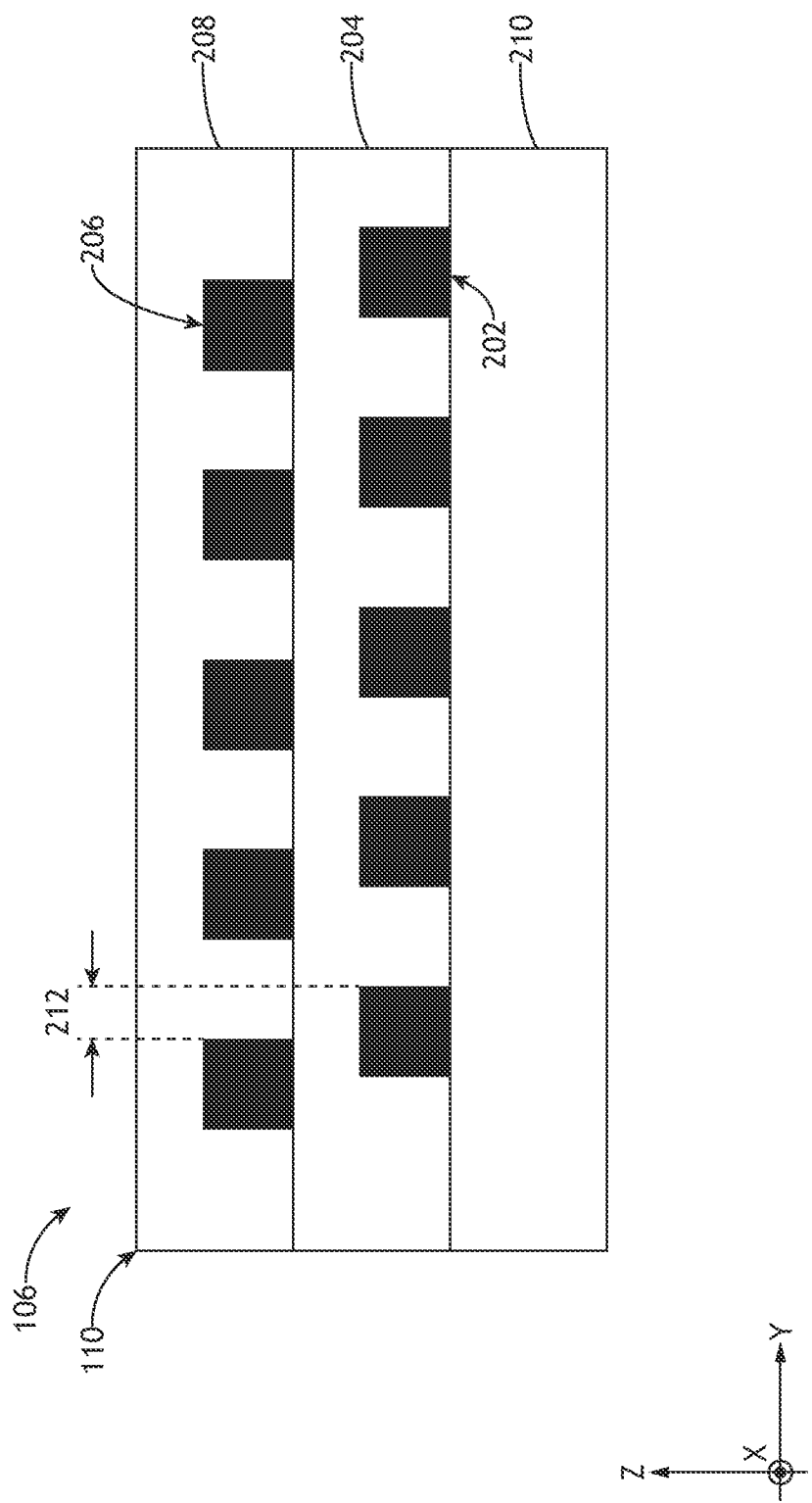
FIG. 2A is a side view of a grating-over-grating structure in a single cell of an overlay target, in accordance with one or more embodiments of the present disclosure.
Figure 2B:
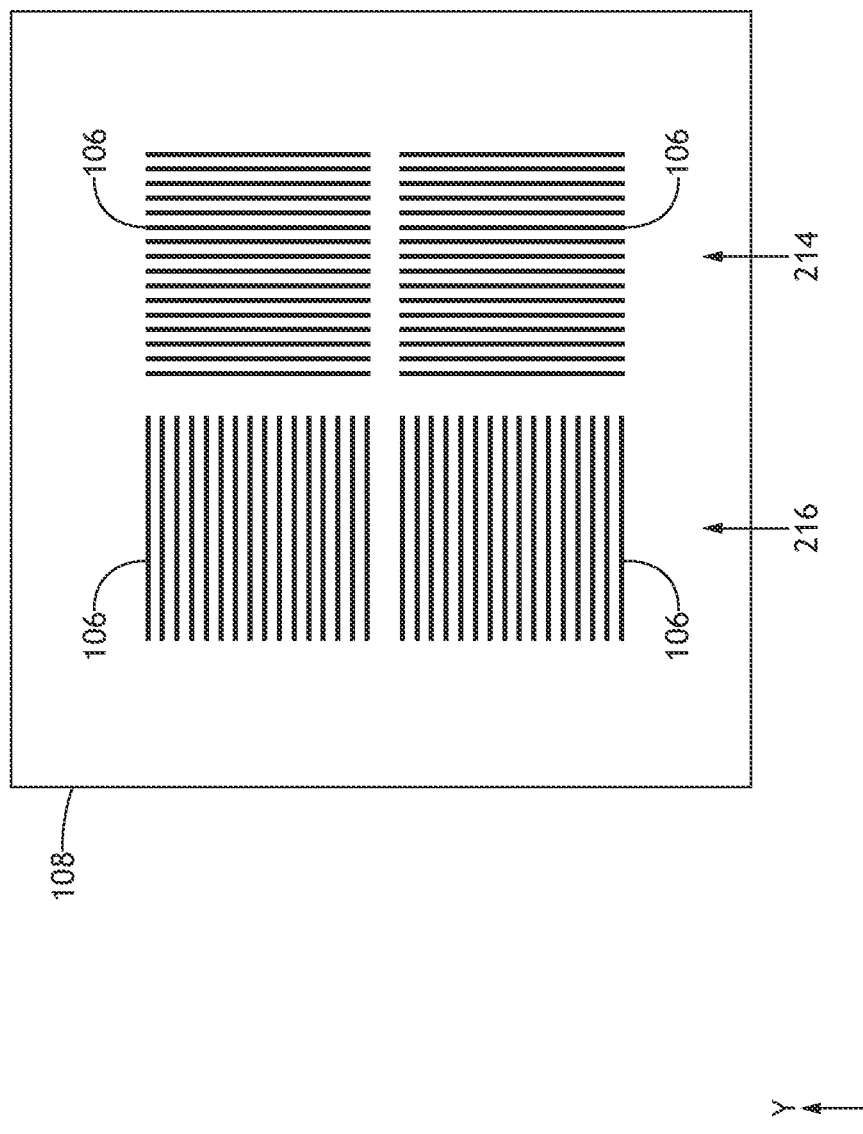
FIG. 2B is a top view of an overlay target in accordance with one or more embodiments of the present disclosure.
Figure 2B:
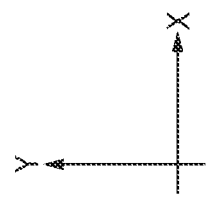

Referring now to FIGS. 2A-2B, various configurations of an overlay target 108 suitable for parallel characterization of constituent cells 106 are described in greater detail in accordance with one or more embodiments of the present disclosure.

FIG. 2A is a side view of a grating-over-grating structure in a single cell 106 of an overlay target 108, in accordance with one or more embodiments of the present disclosure. In some embodiments, a grating-over-grating structure in each cell 106 includes first-layer grating features 202 located on a first layer 204 of the sample 110 and second-layer grating features 206 located on a second layer 208 of the sample 110 oriented such that the regions including the first-layer grating features 202 and the second-layer grating features 206 overlap. In this way, the first-layer grating features 202 and the second-layer grating features 206 may each diffract incident illumination beams 112 into discrete diffraction orders. In general, any number of additional layers, not shown, may be located above, below, or between the first layer 204, the second layer 208, and a substrate 210.

In a general sense, the first-layer grating features 202 and the second-layer grating features 206 may have the same or different distributions and may be intentionally offset from each other by any selected intended offset 212. In some embodiments, the first-layer grating features 202 and the second-layer grating features 206 have the same pitch along the same direction such that the associated diffraction orders overlap in a pupil plane. In some embodiments, the first-layer grating features 202 and the second-layer grating features 206 have different pitches along a particular direction, which may result in Moiré fringes associated with a Moiré pitch larger than the pitches of the first-layer grating features 202 and the second-layer grating features 206. Overlay metrology techniques utilizing Moiré effects are generally described in U.S. Pat. No. 9,182,219 issued on Nov. 10, 2015, U.S. Pat. No. 7,440,105 issued on Oct. 21, 2008, U.S. Pat. No. 7,349,105 issued on Mar. 25, 2008, U.S. Pat. No. 10,551,749 issued on Feb. 4, 2020, U.S. Patent Publication 2021/0072650 published on Mar. 11, 2021, U.S. patent application Ser. No. 16/935,117 filed on Jul. 21, 2020, and U.S. patent application Ser. No. 16/931,078 filed on Jul. 16, 2020, which are all incorporated herein by reference in their entirety.

FIG. 2B is a top view of an overlay target 108, in accordance with one or more embodiments of the present disclosure. In some embodiments, an overlay target 108 includes two or more cells 106 associated with each measurement direction of interest. For example, different cells 106 associated with a particular measurement direction may include grating-over-grating structures with different intended offsets 212.

FIG. 2B illustrates an overlay target 108 having two cells 106 with periodicity along the X direction (e.g., X-direction cells 106) for overlay measurements along the X direction and two cells 106 with periodicity along the Y direction (e.g., Y-direction cells 106) for overlay measurements along the Y direction. The various cells 106 may generally be arranged in any suitable distribution. In some embodiments, as illustrated in FIG. 2B, cells 106 with the same direction of periodicity are distributed in rows. For example, FIG. 2B illustrates X-direction cells 106 along a first row 214 and Y-direction 106 cells along a second row 216. As will be described in greater detail below, this configuration may facilitate efficient sequential illumination of cells 106 having the same direction of periodicity with the same or similar illumination conditions.

It is to be understood, however, that the overlay target 108 in FIGS. 2A-2B and the associated description are provided solely for illustrative purposes and should not be interpreted as limiting. Rather, the overlay target 108 may include any suitable grating-over-grating overlay target design. For example, the overlay target 108 may generally include any number of cells 106 suitable for measurements along two directions. Further, the cells 106 may be distributed in any pattern or arrangement. For example, metrology target designs suitable for scanning metrology are generally described in U.S. patent application Ser. No. 16/598,146 filed on Oct. 10, 2019, which is incorporated herein by reference in its entirety.

Referring now generally to FIGS. 1A-3B, parallel characterization of multiple cells 106 of an overlay target 108 is described in greater detail, in accordance with one or more embodiments of the present disclosure.

Figure 1B:
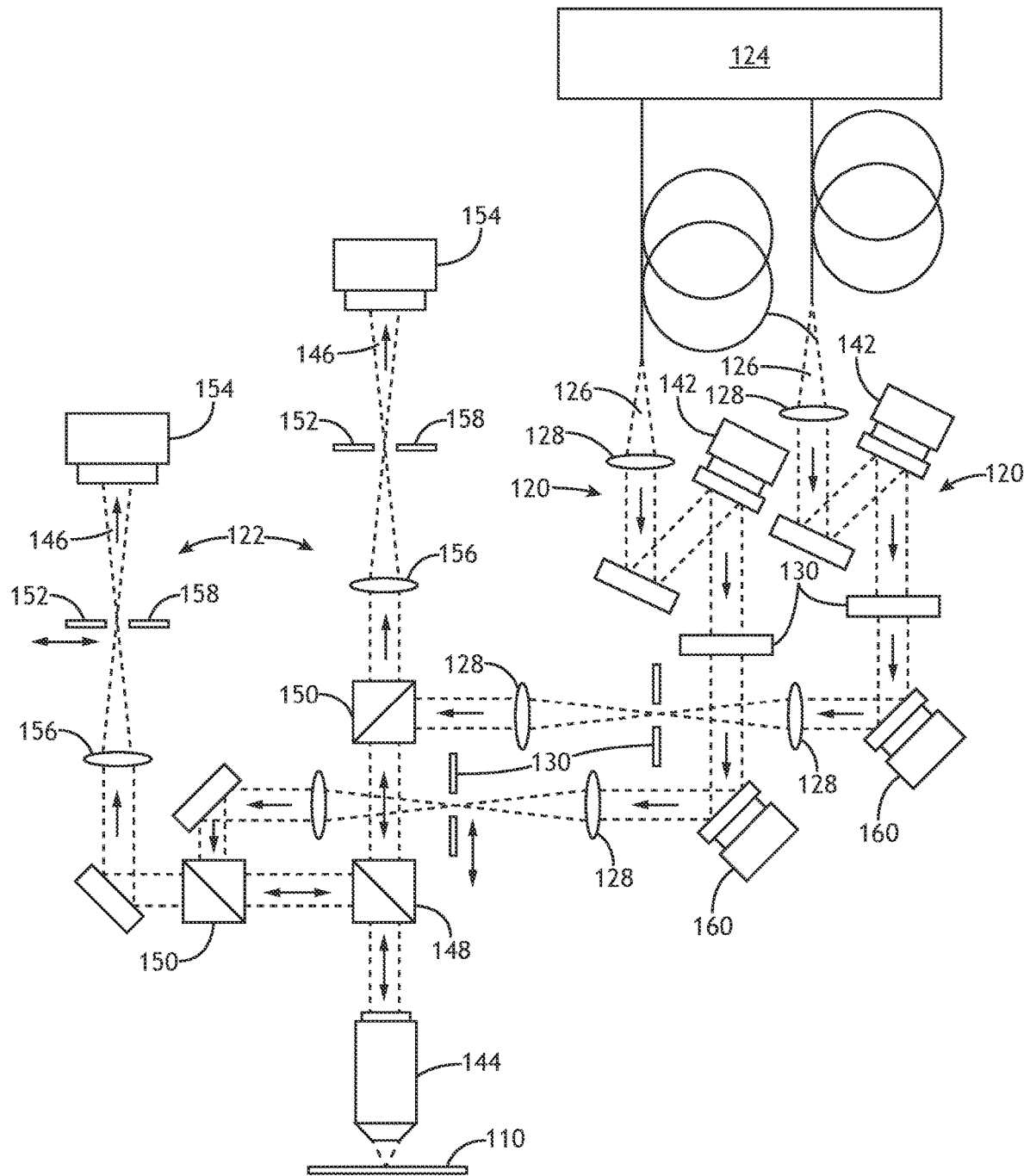
FIG. 1B is a schematic view of the overlay metrology tool illustrating two illumination channels and two collection channels, in accordance with one or more embodiments of the present disclosure.

FIG. 1B is a schematic view of the overlay metrology tool 102 illustrating two illumination channels 120 and two collection channels 122, in accordance with one or more embodiments of the present disclosure. In this way, the overlay metrology tool 102 may simultaneously characterize two cells 106 of an overlay target 108 such as, but not limited to, the overlay target 108 illustrated in FIGS. 2A-2B. In some embodiments, the overlay metrology tool 102 simultaneously characterizes two cells 106 with orthogonal directions of periodicity (e.g., one X-direction cell 106 and one Y-direction cell 106).

In some embodiments, the overlay metrology tool 102 includes at least one illumination source 124 configured to generate illumination 126 suitable for forming the illumination beam distributions to be directed to the cells 106.

The illumination 126 from the illumination source 124 may include one or more selected wavelengths of light including, but not limited to, ultraviolet (UV) radiation, visible radiation, or infrared (IR) radiation.

The illumination source 124 may include any type of illumination source known in the art. In some embodiments, the illumination source 124 is a laser source. For example, the illumination source 124 may include, but is not limited to, one or more narrowband laser sources, a broadband laser source, a supercontinuum laser source, a white light laser source, or the like. In this regard, the illumination source 124 may provide illumination having high coherence (e.g., high spatial coherence and/or temporal coherence). In some embodiments, the illumination source 124 includes a laser-sustained plasma (LSP) source. For example, the illumination source 124 may include, but is not limited to, an LSP lamp, an LSP bulb, or an LSP chamber suitable for containing one or more elements that, when excited by a laser source into a plasma state, may emit broadband illumination. In some embodiments, the illumination source 124 includes a lamp source. For example, the illumination source 124 may include, but is not limited to, an arc lamp, a discharge lamp, an electrode-less lamp, or the like. In this regard, the illumination source 124 may provide illumination having low coherence (e.g., low spatial coherence and/or temporal coherence).

Each illumination channel 120 may direct a distribution of one or more illumination beams 112 (e.g., an illumination beam distribution) to a particular location on the sample 110. An illumination beam distribution may generally include one or more illumination beams 112 or illumination lobes directed to a particular cell 106 with a selected distribution of illumination parameters such as, but not limited to, incidence angles (e.g., azimuth and polar incidence angles), spectra, or polarizations. For example, an illumination beam distribution may include, but is not limited to, a single illumination beam 112 at a selected incidence angle, a dipole distribution of illumination beams 112, or a quadrupole distribution of illumination beams 112. In this way, the illumination channels 120 may simultaneously provide different illumination conditions for different cells 106 on the overlay target 108. Further, in cases where an illumination beam distribution includes multiple illumination beams 112, these illumination beams 112 may be provided simultaneously or sequentially in a given measurement of a cell 106.

In some embodiments, the illumination channels 120 provide illumination beams 112 with orthogonal linear polarizations. For example, one illumination channel 120 may provide a distribution of one or more illumination beams 112 with a linear polarization along a first direction (e.g., an X direction) and another illumination channel 120 may provide a distribution of one or more illumination beams 112 with a linear polarization along a second direction orthogonal to the first direction (e.g., a Y direction). It is contemplated herein that providing orthogonal linear polarizations in the illumination channels 120 may have various benefits such as, but not limited to, efficiently utilizing available power from the illumination source 124, providing well-controlled diffraction by the grating-over-grating structures in each cell 106, and/or facilitating the separation of the collected light 146 of the illuminated cells 106 into different collection channels 122 with a high extinction ratio to prevent cross-contamination of the signals.

Further, the various cells 106 of the overlay target 108 may be illuminated with any selected polarization direction. For example, the overlay metrology tool 102 may illuminate an X-direction cell 106 with linearly polarized light along the X direction and a Y-direction cell 106 with linearly polarized light along the Y direction, or vice versa.

The overlay metrology tool 102 may generally include any combination of optical components to simultaneously generate multiple illumination beam distributions.

In some embodiments, the overlay metrology tool 102 may include a single illumination source 124 to generate illumination 126 for each illumination channel 120. For example, the overlay metrology tool 102 may include a polarizing beamsplitter to split the illumination 126 into orthogonal linear polarizations directed to different illumination channels 120. In some embodiments, the overlay metrology tool 102 includes a separate illumination source 124 for one or more of the illumination channels 120.

The overlay metrology tool 102 may further include various optical components to generate selected illumination beam distributions for each illumination channel 120. In some embodiments, as illustrated in FIG. 1B, each illumination channel 120 may include, one or more illumination lenses 128 or one or more illumination control optics 130 to control various illumination parameters. For example, the illumination control optics 130 may include, but are not limited to, one or more field stops or filters, one or more pupil stops or filters, one or more polarizers, one or more spectral filters, one or more spatial filters, one or more beam splitters, one or more diffusers, one or more homogenizers, one or more apodizers, one or more beam shapers, or one or more mirrors (e.g., static mirrors, translatable mirrors, scanning mirrors, or the like). As an illustration, each illumination channel 120 may include an aperture stop to generate a distribution of one or more illumination beams 112 and/or a field stop to limit a spatial extent of the illumination beams 112 in that channel to an area equal to or smaller than a cell 106 such that the cell is underfilled with illumination.

In a general sense, each illumination channel 120 may provide independent control of the illumination parameters of one or more illumination beams 112. In some embodiments, though not explicitly shown in FIG. 1B, the overlay metrology tool 102 may include illumination lenses 128 and/or illumination control optics 130 to manipulate the illumination 126 prior to entering the illumination channels 120. In this way, selected aspects of the illumination beam distributions may be consistent between the illumination channels 120.

Further, the illumination parameters in each illumination channel 120 may be static or tunable. Tunable illumination parameters may be provided using any technique known in the art. The generation of tunable illumination parameters is generally described in U.S. Pat. No. 10,371,626 issued on Aug. 6, 2019 and U.S. patent application Ser. No. 17/076,312 filed on Oct. 21, 2020, both of which are incorporated herein by reference in their entirety.

In some embodiments, tunable illumination parameters are provided by selectively directing illumination 126 to one of multiple available optical paths having one or more static filters (e.g., spectral filters, neutral density filters, or the like). In some embodiments, tunable illumination parameters are provided by adjusting positions of one or more tunable filters (e.g., spectral filters, neutral density filters, or the like) in an illumination channel 120. In some embodiments, tunable illumination parameters are provided by selectively controlling a position of illumination 126 from the illumination source 124 on one or more spatially-varying filters (e.g., spectral filters, neutral density filters, or the like).

Figure 1C:
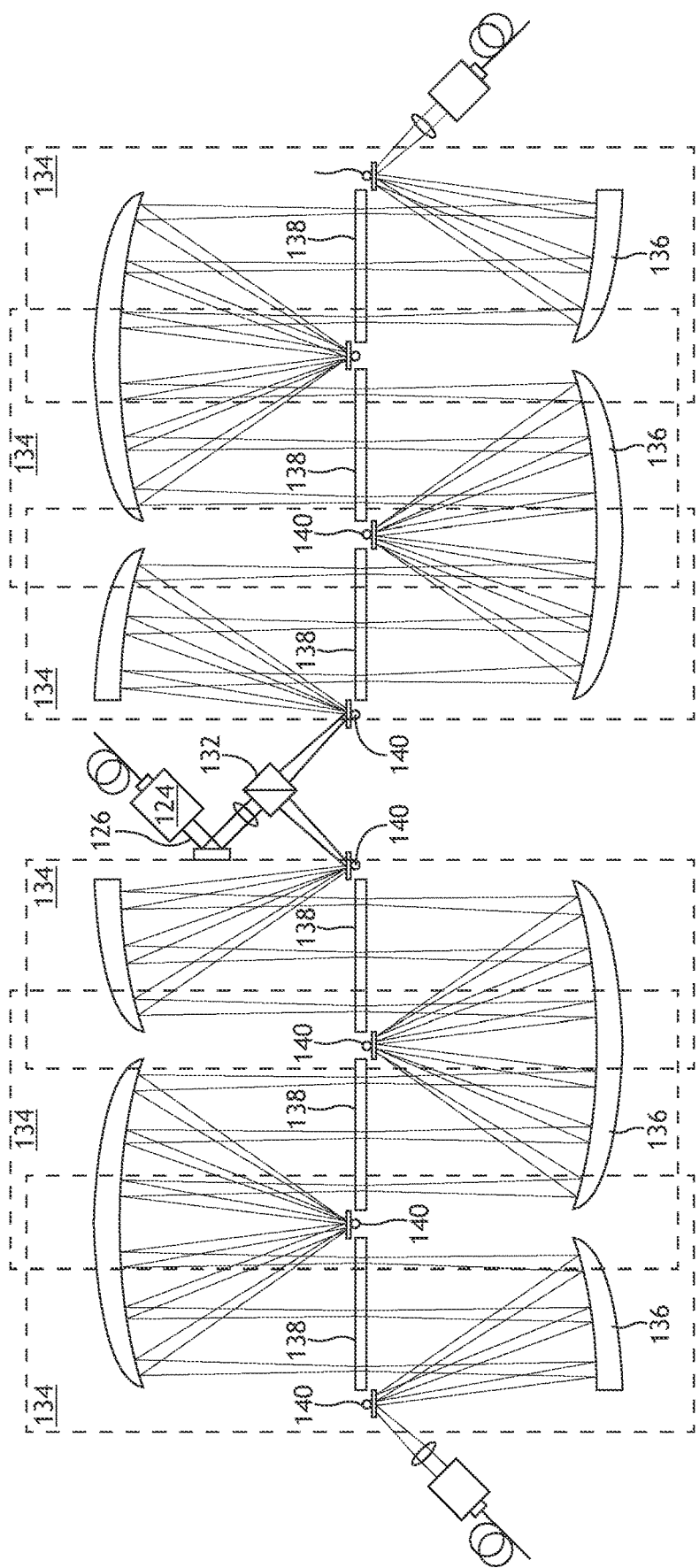
FIG. 1C is a schematic view of a portion of the overlay metrology tool illustrating two illumination channels with separately configurable illumination conditions based on linearly-varying filters, in accordance with one or more embodiments of the present disclosure.

FIG. 1C is a schematic view of a portion of the overlay metrology tool 102 illustrating two illumination channels 120 with separately configurable illumination conditions based on linearly-varying filters, in accordance with one or more embodiments of the present disclosure. Linearly-varying filters may include filters having filtering properties that vary along a linear filtering direction. For example, a linearly-varying neutral density filter may provide varying amounts of broadband intensity reduction based on spatial position of an input beam along the linear axis. By way of another example, a linearly-varying low-pass (or high-pass) filter may provide low-pass filtering with a cutoff wavelength that varies based on the spatial position of the input beam along the linear filtering direction. By way of another example, a linearly-varying filter may be formed as a polarizer, where the direction of polarization passed by the linearly-varying filter may differ at different directions along the linear filtering direction. It is contemplated that the systems and methods disclosed herein may utilize linearly-varying filters that modify any selected property of an input beam.

In some embodiments, the overlay metrology tool 102 includes an illumination source 124 with a spectral bandwidth covering a range of wavelengths of interest and a polarizer 132 to split illumination 126 from the illumination source 124 along two paths associated with two illumination channels 120. For example, the polarizer 132 may be a polarizing beamsplitter to provide orthogonal linear polarizations in the two illumination channels 120.

Each illumination channel 120 may include at least one tunable filter 134 providing tunable control of one or more illumination parameters. In some embodiments, a tunable filter 134 includes a pair of focusing optics 136 in a 4-f configuration, a linearly-varying filter 138 located at a pupil plane (e.g., a focal plane common to the focusing optics 136), and angular scanners 140 located at the other focal planes of the focusing optics 136 as input and/or output couplers to the tunable filter 134. In this way, the position of illumination 126 on the linearly-varying filter 138, and thus the resulting filtering effect on the illumination 126, may be controlled by adjusting an angle of an input angular scanner 140 to receive illumination 126. Further, regardless of the angle of the input angular scanner 140 and the associated position on the linearly-varying filter 138, the illumination 126 will be redirected to a common location on an output tunable filter 134, which may direct the filtered illumination 126 along any desired optical path. For example, the input and output angular scanners 140 may be adjusted simultaneously to provide tunable filtering without modifying the output beam path and thus without impacting the alignment of additional optics of the overlay metrology system 100.

Further, multiple tunable filters 134 may be arranged in series to provide tuning of multiple illumination parameters. For example, FIG. 1C illustrates three tunable filters 134 in each illumination channel 120. Such a configuration may be suitable for, but is not limited to, adjusting the intensity and spectrum of the illumination 126 within each illumination channel 120. For instance, one linearly-varying filter 138 may be a linearly-varying intensity filter, one linearly-varying filter 138 may be a linearly-varying low-pass spectral filter, and one linearly-varying filter 138 may be a linearly-varying high-pass spectral filter.

In some embodiments, the overlay metrology tool 102 includes one or more focus-control optics 142 to adjust or control a focal position of one or more illumination beams 112 in one or more illumination channels 120. It is contemplated herein that focal position adjustments may be particularly useful for, but not limited to, measurements with different wavelengths or measurements of features at different depths. For example, illumination beams 112 in different illumination channels 120 may have different spectral ranges. By way of another example, measurement robustness may be improved by capturing data from each cell 106 at multiple different wavelengths. In either case, chromatic aberrations in the sample 110 and/or the overlay metrology system 100 may result in different focusing or imaging conditions at different wavelengths such that focal correction in one or more illumination channels 120 may be required.

As an illustration, FIG. 1B includes focus-control optics 142 in each of the illumination channels 120 to provide independent focus control for the associated illumination beams 112. The focus-control optics 142 may include any type or combination of optical elements suitable for modifying a focal position of at least one illumination beam 112 such as, but not limited to, one or more deformable mirrors, one or more acousto-optic lenses, one or more voice coils, or one or more translatable lenses (e.g., any of the illumination lenses 128). In some embodiments, the focus-control optics 142 may be designed to provide focus switching within a time required to tune one or more additional illumination parameters (e.g., spectrum, intensity, angular distribution of illumination, or the like) to facilitate high measurement throughput. In this way, the focus-control optics 142 may operate as fast focus controllers.

Referring again to FIGS. 1A-1C, the overlay metrology tool 102 may generate or otherwise control the illumination beam distributions (e.g., the number and incidence angles of the constituent illumination beams 112) using any technique known in the art.

In some embodiments, the overlay metrology system 100 includes one or more apertures (e.g., illumination control optics 130) at an illumination pupil plane to define one or more illumination beams 112. In some embodiments, the overlay metrology system 100 generates illumination beams 112 by providing light in two or more optical fibers, where light output from each optical fiber provided at or directed to an illumination pupil to provide an illumination beam 112. In some embodiments, the overlay metrology system 100 generates one or more illumination beams 112 by diffracting illumination 126 from the illumination source 124 into two or more diffraction orders, where at least one of the diffraction orders forms at least one illumination beam 112. Efficient generation of multiple illumination beams through controlled diffraction is generally described in U.S. Patent Publication US2020/0124408 published on Apr. 23, 2020, which is incorporated herein by reference in its entirety.

In some embodiments, the overlay metrology tool 102 includes an objective lens 144 to capture light or other radiation emanating from both illuminated cells 106 (e.g., collected light 146). Further, an illumination beam 112 from any illumination channel 120 may generally be directed to the sample 110 through the objective lens 144 (e.g., in a through-the-lens (TTL) configuration) or outside a numerical aperture of the objective lens 144 (e.g., in an outside-the-lens (OTL) configuration). For example, FIG. 1B illustrates a TTL configuration.

In some embodiments, the overlay metrology tool 102 includes one or more filtering optics to separate the collected light 146 from the two illuminated cells 106 into different collection channels 122. For example, the filtering optics may selectively direct portions of the collected light 116 associated with the X-direction cell 106 to one collection channel 122 and collected light 116 associated with the Y-direction cell 106 to another collection channel 122.

The one or more filtering optics may separate the collected light 116 associated with the two illuminated cells 106 using any technique or combination of techniques including, but not limited to, polarization filtering, pupil-plane filtering, or field-plane filtering.

In some embodiments, the filtering optics include one or more polarization filters such as, but not limited to, one or more linear polarizers or one or more polarizing beamsplitters to implement polarization filtering. It is contemplated herein that polarization filtering may be particularly effective when the illumination channels 120 provide illumination beam distributions with orthogonal linear polarizations since the collected light 116 may generally retain the polarization direction of the illumination.

For example, as illustrated in FIG. 1B, the overlay metrology tool 102 includes a polarizing beamsplitter 148 in a location common to the illumination 126 and collected light 116. In this configuration, the polarizing beamsplitter 148 may receive orthogonally linearly polarized illumination 126 from each of the illumination channels 120 and deliver this light to the objective lens 144. This polarizing beamsplitter 148 may then receive the collected light 116 from both illuminated cells 106 and split this collected light 116 into the two collection channels 122 based on polarization. FIG. 1B further illustrates two non-polarizing beamsplitters 150, one associated with each polarization direction, to separate illumination 126 and collected light 116 for that polarization direction.

By way of another example, though not explicitly shown, the overlay metrology tool 102 may include one or more linear polarizers in either or both of the collection channels 122. For example, one collection channel 122 may include a linear polarizer aligned along the X direction and one collection channel 122 may include a linear polarizer aligned along the Y direction. In this configuration, the linear polarizers may implement polarization filtering, which may be achieved even if the illumination beam distribution does not have orthogonal linear polarizations. Further, polarizers in a collection channel 122 may provide a higher extinction ratio than provided by the polarizing beamsplitter 148 and may thus further reduce cross-talk between collected light 116 associated with different cells 106.

In some embodiments, the filtering optics include one or more spatial filters in one or more pupil planes (e.g., pupil-plane filters). It is contemplated herein that a grating-over-grating structure will generate diffraction orders that are distributed in the direction of periodicity. Accordingly, diffraction orders from cells 106 having orthogonal directions of periodicity will be distributed in orthogonal directions in a pupil plane and may thus be filtered using pupil-plane filters.

Figure 3B:
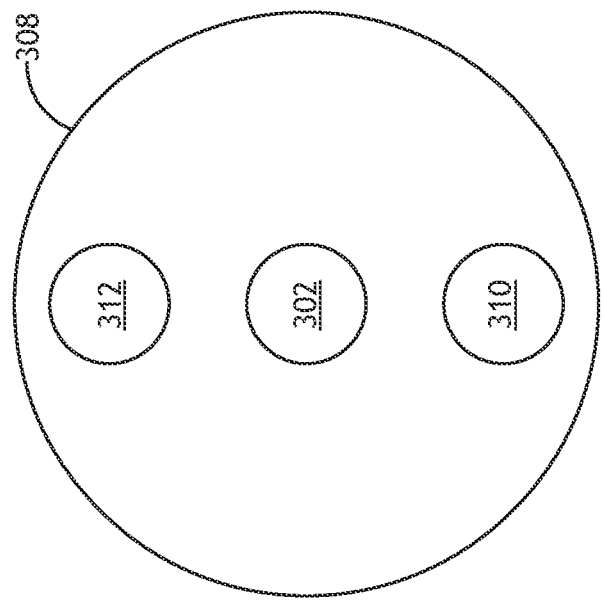
FIG. 3B is a top view of a pupil plane illustrating a distribution of diffraction orders from a Y-direction cell of the overlay target in FIG. 2B, in accordance with one or more embodiments of the present disclosure.
Figure 3A:
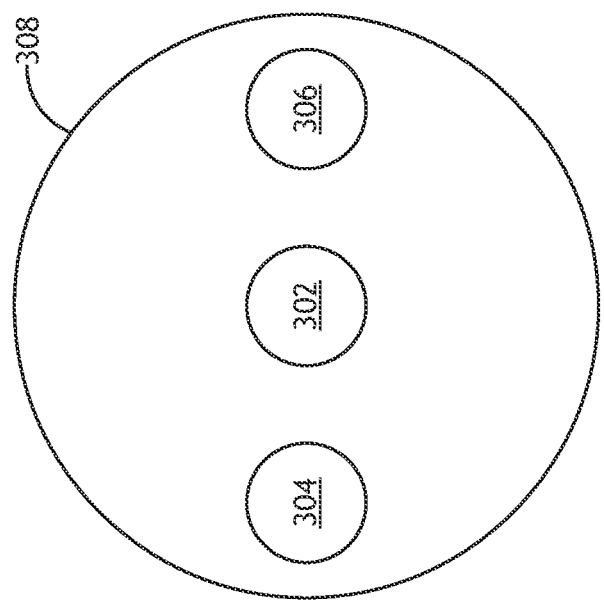
FIG. 3A is a top view of a pupil plane illustrating a distribution of diffraction orders from an X-direction cell of the overlay target in FIG. 2B, in accordance with one or more embodiments of the present disclosure.

FIGS. 3A-3B illustrate the spatial distribution of diffraction orders from illuminated cells 106 of the overlay target 108 of FIG. 2B, in accordance with one or more embodiments of the present disclosure. FIG. 3A is a top view of a pupil plane illustrating a distribution of diffraction orders from an X-direction cell 106 of the overlay target 108 in FIG. 2B, in accordance with one or more embodiments of the present disclosure. In particular, FIG. 3A illustrates 0-order diffraction 302 (e.g., specular reflection), X-direction −1-order diffraction 304, and X-direction +1-order diffraction 306 within a pupil boundary 308 in response to a single illumination beam 112 at a normal incidence angle. FIG. 3B is a top view of a pupil plane illustrating a distribution of diffraction orders from a Y-direction cell 106 of the overlay target 108 in FIG. 2B, in accordance with one or more embodiments of the present disclosure. In particular, FIG. 3B illustrates 0-order diffraction 302, Y-direction −1-order diffraction 310, and Y-direction +1-order diffraction 312 within the pupil boundary 308 in response to a single illumination beam 112 at a normal incidence angle. As illustrated in FIGS. 3A and 3B, the nonzero diffraction orders from the X-direction cell 106 and the Y-direction cell 106 are non-overlapping in the pupil plane and may be isolated using pupil-plane filters. For example, one collection channel 122 may include a pupil-plane filter having apertures oriented to pass at least the X-direction −1-order diffraction 304 and X-direction +1-order diffraction 306 to isolate the collected light 116 from the illuminated X-direction cell 106, and one collection channel 122 may include a pupil-plane filter having apertures oriented to pass at least the Y-direction −1-order diffraction 310 and Y-direction +1-order diffraction 312 to isolate the collected light 116 from the illuminated Y-direction cell 106.

In some embodiments, the filtering optics include one or more spatial filters in one or more field planes (e.g., field-plane filters). For example, FIG. 1B illustrates field stops 152 in each of the collection channels 122. In particular, a field stop 152 in a collection channel 122 may limit a collection area in that channel to a particular cell 106.

In some embodiments, each collection channel 122 includes one or more detectors 154 configured to capture collected light 116 in the channel. Each collection channel 122 may further include one or more optical elements suitable for modifying and/or conditioning the collected light 146 from the sample 110. In some embodiments, a collection channel 122 includes one or more collection-pathway lenses 156 (e.g., to collimate illumination, to relay pupil and/or field planes, or the like), which may include, but is not required to include, the objective lens 144. In some embodiments, a collection channel 122 includes one or more collection-pathway optics 158 to shape or otherwise control the collected light 146. For example, the collection-pathway optics 158 may include, but are not limited to, one or more field stops, one or more aperture stops, one or more polarizers, one or more spectral filters, one or more intensity filters, one or more beam splitters, one or more diffusers, one or more homogenizers, one or more apodizers, one or more beam shapers, or one or more mirrors (e.g., static mirrors, translatable mirrors, scanning mirrors, or the like).

A detector 154 may be located at any selected location within a collection channel 122. In some embodiments, the overlay metrology tool 102 includes a detector 154 at a pupil plane (e.g., a diffraction plane) to generate a pupil image. In this regard, the pupil image may correspond to an angular distribution of light from the sample 110 on a detector 154. For instance, diffraction orders associated with diffraction from grating-over-grating structures in a cell 106 may be imaged or otherwise observed in the pupil plane. In a general sense, a detector 154 may capture any combination of reflected (or transmitted), scattered, or diffracted light from the sample 110. In some embodiments, the overlay metrology tool 102 includes a detector 154 at a field plane (e.g., a plane conjugate to the sample 110) to generate an image of the sample 110 based on selected diffraction orders from the cell 106.

The overlay metrology tool 102 may generally include any number or type of detectors 154 suitable for capturing light from the sample 110 indicative of overlay. In some embodiments, the detector 154 includes one or more detectors 154 suitable for characterizing a static sample. In this regard, the overlay metrology tool 102 may operate in a static mode in which the sample 110 is static during a measurement. For example, a detector 154 may include a two-dimensional pixel array such as, but not limited to, a charge-coupled device (CCD) or a complementary metal-oxide semiconductor (CMOS) device. In this regard, the detector 154 may generate a two-dimensional image (e.g., a field-plane image or a pupil-plan image) in a single measurement.

In some embodiments, the detector 154 includes one or more detectors 154 suitable for characterizing a moving sample (e.g., a scanned sample). In this regard, the overlay metrology tool 102 may operate in a scanning mode in which the sample 110 is scanned with respect to a measurement field during a measurement. For example, the detector 154 may include a 2D pixel array with a capture time and/or a refresh rate sufficient to capture one or more images during a scan within selected image tolerances (e.g., image blur, contrast, sharpness, or the like). By way of another example, the detector 154 may include a line-scan detector to continuously generate an image one line of pixels at a time. By way of another example, the detector 154 may include a time-delay integration (TDI) detector. A TDI detector may generate a continuous image of the sample 110 when the motion of the sample 110 is synchronized to charge-transfer clock signals in the TDI detector.

In some embodiments, the overlay metrology system 100 includes one or more beam-scanning optics 160 to control a position of one or more illumination beams 112 (or illumination beam distributions) on the sample 110. As an illustration, FIG. 1B includes beam-scanning optics 160 in each illumination channel 120.

It is contemplated herein that beam-scanning optics 160 may be utilized in a variety of ways in accordance with one or more embodiments of the present disclosure.

In some embodiments, beam-scanning optics 160 located in both illumination channels 120 may scan in a synchronous pattern to scan the respective illumination distributions across the cells 106. This synchronous scanning may beneficially mitigate noise associated with imperfections of the grating-over-grating structures and/or mitigating the impact of speckle associated with coherent illumination 126. It is contemplated herein, however, that such speckle may be additionally or alternately mitigated using other techniques. For example, coherent illumination 126 may be scanned over an input face of a multi-mode fiber, where the output of the multi-mode fiber is imaged onto the sample 110. Such a multi-mode fiber may be located prior to or within any of the illumination channels 120.

In some embodiments, beam-scanning optics 160 in one or more of the illumination channels 120 are used to adjust or otherwise control a separation of the associated illumination beam distributions. In this way, the illumination beam distribution from each illumination channel 120 may be centered on different cells 106. Further, this configuration may flexibly provide measurements for targets with any selected cell separation. For example, in FIG. 1B, the beam-scanning optics 160 may tilt in a plane of the illustration to deviate the associated illumination beam distributions on the sample 110 in the plane of the illustration.

It is further contemplated herein that it may be desirable to ensure that illumination 126 and/or collected light 116 is centered in any field stops to avoid asymmetric diffraction during either illumination or collection. In some embodiments, the overlay metrology system 100 includes one or more adjustable field stops (e.g., field stops mounted to actuators, or the like), which may be, but are not required to be, synchronized to other components. For example, FIG. 1B illustrates adjustable field stops 152 in both the illumination channels 120 and the collection channels 122, which may optionally be synchronized to the beam-scanning optics 160. In this way, the illumination 126 and collected light 116 may remain centered in the respective stops even as the positions of the illumination beam distributions on the sample 110 are adjusted.

Referring again to FIG. 1A, various additional components of the overlay metrology system 100 are described in greater detail in accordance with one or more embodiments of the present disclosure.

In some embodiments, the overlay metrology system 100 includes a controller 162 communicatively coupled to the overlay metrology tool 102 and/or any components therein. In some embodiments, the controller 162 includes one or more processors 164. For example, the one or more processors 164 may be configured to execute a set of program instructions maintained in a memory device 166, or memory. The one or more processors 164 of a controller 162 may include any processing element known in the art. In this sense, the one or more processors 164 may include any microprocessor-type device configured to execute algorithms and/or instructions.

The one or more processors 164 of a controller 162 may include any processor or processing element known in the art. For the purposes of the present disclosure, the term "processor" or "processing element" may be broadly defined to encompass any device having one or more processing or logic elements (e.g., one or more microprocessor devices, one or more application specific integrated circuit (ASIC) devices, one or more field programmable gate arrays (FPGAs), or one or more digital signal processors (DSPs)). In this sense, the one or more processors 164 may include any device configured to execute algorithms and/or instructions (e.g., program instructions stored in memory). In some embodiments, the one or more processors 164 may be embodied as a desktop computer, mainframe computer system, workstation, image computer, parallel processor, networked computer, or any other computer system configured to execute a program configured to operate or operate in conjunction with the overlay metrology system 100, as described throughout the present disclosure. Moreover, different subsystems of the overlay metrology system 100 may include a processor or logic elements suitable for carrying out at least a portion of the steps described in the present disclosure. Therefore, the above description should not be interpreted as a limitation on the embodiments of the present disclosure but merely as an illustration. Further, the steps described throughout the present disclosure may be carried out by a single controller or, alternatively, multiple controllers. Additionally, the controller 162 may include one or more controllers housed in a common housing or within multiple housings. In this way, any controller or combination of controllers may be separately packaged as a module suitable for integration into overlay metrology system 100.

The memory device 166 may include any storage medium known in the art suitable for storing program instructions executable by the associated one or more processors 164. For example, the memory device 166 may include a non-transitory memory medium. By way of another example, the memory device 166 may include, but is not limited to, a read-only memory (ROM), a random-access memory (RAM), a magnetic or optical memory device (e.g., disk), a magnetic tape, a solid-state drive and the like. It is further noted that the memory device 166 may be housed in a common controller housing with the one or more processors 164. In some embodiments, the memory device 166 may be located remotely with respect to the physical location of the one or more processors 164 and the controller 162. For instance, the one or more processors 164 of the controller 162 may access a remote memory (e.g., server), accessible through a network (e.g., internet, intranet and the like).

The controller 162 may direct (e.g., through control signals) or receive data from the overlay metrology tool 102 or any components therein. The controller 162 may further be configured to perform any of the various process steps described throughout the present disclosure.

In some embodiments, the overlay metrology system 100 includes a user interface 168 communicatively coupled to the controller 162. In some embodiments, the user interface 168 may include, but is not limited to, one or more desktops, laptops, tablets, and the like. In some embodiments, the user interface 168 includes a display used to display data of the overlay metrology system 100 to a user. The display of the user interface 168 may include any display known in the art. For example, the display may include, but is not limited to, a liquid crystal display (LCD), an organic light-emitting diode (OLED) based display, or a CRT display. Those skilled in the art should recognize that any display device capable of integration with a user interface 168 is suitable for implementation in the present disclosure. In some embodiments, a user may input selections and/or instructions responsive to data displayed to the user via a user input device of the user interface 168.

Figure 4:
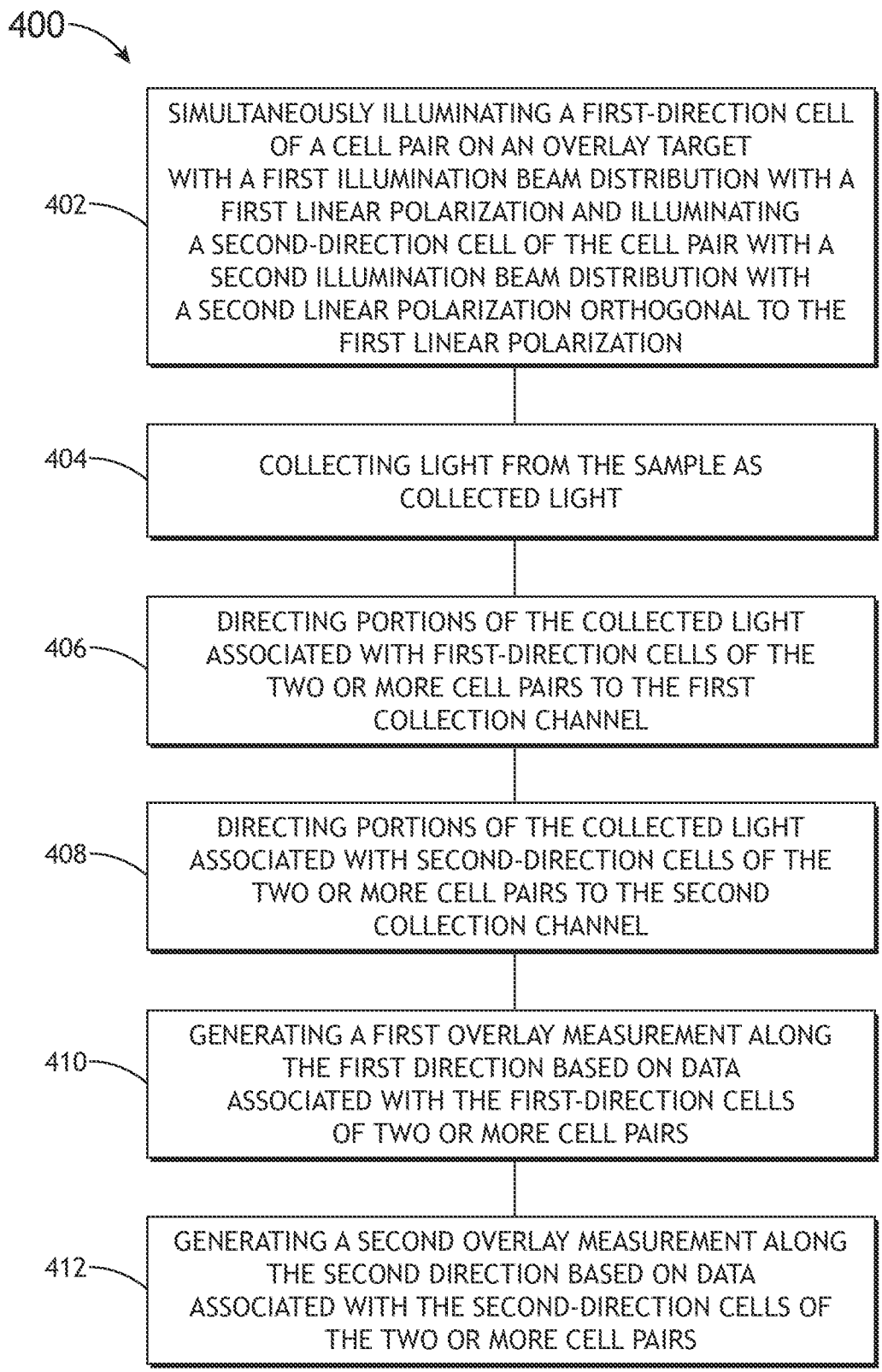
FIG. 4 is a flow diagram illustrating steps performed in a method for overlay metrology, in accordance with one or more embodiments of the present disclosure.

Referring now to FIG. 4, FIG. 4 is a flow diagram illustrating steps performed in a method 400 for overlay metrology, in accordance with one or more embodiments of the present disclosure. Applicant notes that the embodiments and enabling technologies described previously herein in the context of the overlay metrology system 100 should be interpreted to extend to the method 400. It is further noted, however, that the method 400 is not limited to the architecture of the overlay metrology system 100.

In some embodiments, the method 400 includes a step 402 of simultaneously illuminating a first-direction cell of a cell pair on an overlay target with a first illumination beam distribution with a first linear polarization and illuminating a second-direction cell of the cell pair with a second illumination beam distribution with a second linear polarization orthogonal to the first linear polarization. For example, an overlay target may include two or more cell pairs with grating-over-grating structures oriented in orthogonal directions as illustrated in FIGS. 2A-2B.

The step 402 may include illuminating the first-direction and second-direction cells with any number or configuration of illumination beams, where the first and second illumination beam distributions may be separately controlled. In some embodiments, the step 402 may include underfilling both the first-direction and second-direction cells with the first and second illumination beam distributions. Further, the step 402 may include synchronously scanning the first and second illumination beam distributions across the first-direction and second-direction cells, which may mitigate target noise and/or speckle.

In some embodiments, the method 400 includes a step 404 of collecting light from the sample (e.g., the first-direction and second-direction cells) as collected light. In some embodiments, the method 400 includes a step 406 of directing portions of the collected light associated with first-direction cells of the two or more cell pairs to the first collection channel. In some embodiments, the method 400 includes a step 408 of directing portions of the collected light associated with second-direction cells of the two or more cell pairs to the second collection channel. In this way, collected light indicative of overlay for the first-direction cell and the second-direction cell may be collected in parallel. For example, step 406 and/or step 408 may be implemented using any combination of polarization filters, pupil-plane filters, or field-plane filters such as, but not limited to, those illustrated in the context of the overlay metrology system 100.

In some embodiments, the method 400 includes a step 410 of generating a first overlay measurement along the first direction based on data associated with the first-direction cells of two or more cell pairs (e.g., based on repeating steps 402-408 for two or more cell pairs). In some embodiments, the method 400 includes a step 412 of generating a second overlay measurement along the second direction based on data associated with the second-direction cells of the two or more cell pairs.

It is contemplated herein that the method 400 may beneficially provide for parallel measurements of target cells with minimal or negligible cross-talk of the collected light. In this way, the method 400 may reduce the required number of sequential measurements of a given overlay target by a factor of two relative to techniques in which all cells are sequentially measured. Further, this throughput increase may not sacrifice the accuracy or sensitivity of the measurements.

The herein described subject matter sometimes illustrates different components contained within, or connected with, other components. It is to be understood that such depicted architectures are merely exemplary, and that in fact many other architectures can be implemented which achieve the same functionality. In a conceptual sense, any arrangement of components to achieve the same functionality is effectively "associated" such that the desired functionality is achieved. Hence, any two components herein combined to achieve a particular functionality can be seen as "associated with" each other such that the desired functionality is achieved, irrespective of architectures or intermedial components. Likewise, any two components so associated can also be viewed as being "connected" or "coupled" to each other to achieve the desired functionality, and any two components capable of being so associated can also be viewed as being "couplable" to each other to achieve the desired functionality. Specific examples of couplable include but are not limited to physically interactable and/or physically interacting components and/or wirelessly interactable and/or wirelessly interacting components and/or logically interactable and/or logically interacting components.

It is believed that the present disclosure and many of its attendant advantages will be understood by the foregoing description, and it will be apparent that various changes may be made in the form, construction, and arrangement of the components without departing from the disclosed subject matter or without sacrificing all of its material advantages. The form described is merely explanatory, and it is the intention of the following claims to encompass and include such changes. Furthermore, it is to be understood that the invention is defined by the appended claims.

What is claimed:

1. An overlay metrology tool comprising:
    an illumination source configured to generate a first illumination beam distribution with a first linear polarization and a second illumination beam distribution with a second linear polarization orthogonal to the first linear polarization;
    an illumination sub-system to sequentially illuminate two or more cell pairs of an overlay target on a sample, wherein a particular one of the two or more cell pairs includes a first-direction cell with a grating-over-grating structure having periodicity along a first direction and a second-direction cell with a grating-over-grating structure having periodicity along a second direction orthogonal to the first direction, wherein the illumination sub-system simultaneously illuminates the first-direction cell with the first illumination beam distribution and the second-direction cell with the second illumination beam distribution;
    a collection sub-system comprising:
        a first collection channel including one or more first-channel detectors at a first-channel detection plane;
        a second collection channel including one or more second-channel detectors at a second-channel detection plane;
        an objective lens to collect light from the sample as collected light; and
        one or more filtering optics to direct portions of the collected light associated with first-direction cells of the two or more cell pairs to the first collection channel and direct portions of the collected light associated with second-direction cells of the two or more cell pairs to the second collection channel; and a controller communicatively coupled to the first and second collection channels, the controller including one or more processors configured to execute program instructions causing the one or more processors to:

generate a first overlay measurement along the first direction based on data associated with the first-direction cells of the two or more cell pairs from the one or more first-channel detectors; and generate a second overlay measurement along the second direction based on data associated with the second-direction cells of the two or more cell pairs from the one or more second-channel detectors.

2. The overlay metrology tool of claim 1, further comprising:

one or more beam-scanning optics configured to adjust a separation between the first and second illumination beam distributions.

3. The overlay metrology tool of claim 2, wherein the one or more beam-scanning optics adjust the separation between the first and second illumination beam distributions to center the first and second illumination beam distributions on the first-direction cell and the second-direction cell of an illuminated one of the two or more cell pairs.

4. The overlay metrology tool of claim 2, further comprising:

a first illumination field stop to define a spatial extent of the first illumination beam distribution; and a second illumination field stop to define a spatial extent of the second illumination beam distribution, wherein at least one of the first or second illumination field stops is adjustable and synchronized to the one or more beam-scanning optics to provide that the first and second illumination beam distributions are centered in the first and second illumination field stops as the separation between the first and second illumination beam distributions is adjusted.

5. The overlay metrology tool of claim 2, further comprising:

a first collection field stop to define a collection field for the first collection channel; and a second illumination field stop to define a collection field for the second collection channel, wherein at least one of the first or second collection field stops is adjustable and synchronized to the one or more beam-scanning optics to provide that the first and second collection fields are aligned with the first and second illumination beam distributions as the separation between the first and second illumination beam distributions is adjusted.

6. The overlay metrology tool of claim 1, further comprising:

one or more beam-scanning optics configured to modulate the first and second illumination beam distributions across the first-direction cell and the second-direction cell of an illuminated one of the two or more cell pairs during a measurement.

7. The overlay metrology tool of claim 1, wherein grating-over-grating structures in the first-direction cells of the two or more cell pairs are arranged along a first row of the overlay target, wherein grating-over-grating structures in the second-direction cells of the two or more cell pairs are arranged along a second row of the overlay target.

8. The overlay metrology tool of claim 1, wherein grating-over-grating structures in the first-direction cells of the two or more cell pairs have different intended overlay offsets along the first direction, wherein grating-over-grating structures in the second-direction cells of the two or more cell pairs have different intended overlay offsets along the second direction.

9. The overlay metrology tool of claim 1, wherein the two or more cell pairs comprise:

a first cell pair and a second cell pair, wherein a first-direction cell of the first cell pair and a first-direction cell of the second cell pair have equal and opposite intended offsets along the first direction, wherein a second-direction cell of the first cell pair and a second-direction cell of the second cell pair have equal and opposite intended offsets along the second direction.

10. The overlay metrology tool of claim 1, wherein the second illumination beam distribution is equal to the first illumination beam distribution.

11. The overlay metrology tool of claim 1, wherein the second illumination beam distribution is different than the first illumination beam distribution.

12. The overlay metrology tool of claim 1, wherein the second illumination beam distribution is different than the first illumination beam distribution based on at least one of a number of illumination beams, a wavelength of one or more illumination beams, or an angle of incidence of one or more illumination beams.

13. The overlay metrology tool of claim 1, wherein at least one of the first or second illumination beam distributions comprises:

a single illumination beam.

14. The overlay metrology tool of claim 1, wherein the first illumination beam distribution comprises:

two illumination beams in a dipole distribution aligned along the first direction, wherein the second illumination beam distribution comprises:

two illumination beams in a dipole distribution aligned along the second direction.

15. The overlay metrology tool of claim 1, wherein the one or more filtering optics comprises:

at least one of one or more polarization-filtering optics, one or more pupil-plane filters, or one or more field-plane filters.

16. The overlay metrology tool of claim 15, wherein the one or more polarization-filtering optics comprises:

one or more polarizing beamsplitters to direct portions of the collected light having the first linear polarization to the first collection channel and direct portions of the collected light having the second linear polarization to the second collection channel.

17. The overlay metrology tool of claim 15, wherein the one or more polarization-filtering optics comprises:

at least one of a first polarizer in the first collection channel oriented to pass the first linear polarization, or a second polarizer in the second collection channel oriented to pass the second linear polarization.

18. The overlay metrology tool of claim 15, wherein the one or more pupil-plane filters comprises:

at least one of a first aperture in a pupil plane of the first collection channel to pass portions of the collected light associated with diffraction along the first direction, a second aperture in a pupil plane of the second collection channel to pass portions of the collected light associated with diffraction along the second direction, or a beamsplitter in a pupil plane common to the first and second collection channels to direct the portions of the collected light associated with diffraction along the first direction to the first collection channel and direct the portions of the collected light associated with diffraction along the second direction to the second collection channel.

19. The overlay metrology tool of claim 15, wherein the one or more field-plane filters comprises:
at least one of an aperture in a field plane of the first collection channel to pass portions of the collected light associated with the first-direction cells, or an aperture in a field plane of the second collection channel to pass portions of the collected light associated with the second-direction cells.

20. The overlay metrology tool of claim 1, further comprising:
a translation stage to sequentially place the two or more cell pairs for illumination with the illumination sub-system.

21. The overlay metrology tool of claim 1, further comprising:
one or more focus-control optics to adjust a focal position of at least one of the first or second illumination beam distributions.

22. The overlay metrology tool of claim 1, wherein at least one of the first or second detection planes comprises:
a pupil plane.

23. The overlay metrology tool of claim 1, wherein at least one of the first or second detection planes comprises:
a field plane.

24. An overlay metrology tool comprising:
an illumination source configured to generate a first illumination beam distribution with a first linear polarization and a second illumination beam distribution with a second linear polarization orthogonal to the first linear polarization;
an illumination sub-system to sequentially illuminate two or more cell pairs of an overlay target on a sample, wherein a particular one of the two or more cell pairs includes a first-direction cell with a grating-over-grating structure having periodicity along a first direction and a second-direction cell with a grating-over-grating structure having periodicity along a second direction orthogonal to the first direction, the illumination sub-system comprising:
a first illumination channel to direct the first illumination beam distribution to the first-direction cell of one of the two or more cell pairs, wherein the first illumination beam distribution includes one or more first illumination beams with the first linear polarization; and
a second illumination channel to direct the second illumination beam distribution to the second-direction cell of one of the two or more cell pairs simultaneously with the first illumination beam distribution, wherein the second illumination beam distribution includes one or more second illumination beams with the second linear polarization;
a collection sub-system comprising:
a first collection channel including one or more first-channel detectors at a first-channel detection plane;
a second collection channel including one or more second-channel detectors at a second-channel detection plane;
an objective lens to collect light from the sample as collected light; and
a polarizing beamsplitter to direct portions of the collected light associated with first-direction cells having the first linear polarization to the first collection channel and direct portions of the collected light associated with second-direction cells of the two or more cell pairs having the second linear polarization to the second collection channel; and
a controller communicatively coupled to the first and second collection channels, the controller including one or more processors configured to execute program instructions causing the one or more processors to:
generate a first overlay measurement along the first direction based on data associated with the first-direction cells of the two or more cell pairs from the one or more first-channel detectors; and
generate a second overlay measurement along the second direction based on data associated with the second-direction cells of the two or more cell pairs from the one or more second-channel detectors.

25. The overlay metrology tool of claim 24, further comprising:
at least one of a first aperture in a pupil plane of the first collection channel to pass portions of the collected light associated with diffraction along the first direction, a second aperture in a pupil plane of the second collection channel to pass portions of the collected light associated with diffraction along the second direction, or a beamsplitter in a pupil plane common to the first and second collection channels to direct the portions of the collected light associated with diffraction along the first direction to the first collection channel and direct the portions of the collected light associated with diffraction along the second direction to the second collection channel.

26. The overlay metrology tool of claim 24, further comprising:
at least one of an aperture in a field plane of the first collection channel to pass portions of the collected light associated with the first-direction cells, or an aperture in a field plane of the second collection channel to pass portions of the collected light associated with the second-direction cells.

27. The overlay metrology tool of claim 24, further comprising:
one or more beam-scanning optics configured to adjust a separation between the first and second illumination beam distributions.

28. The overlay metrology tool of claim 27, wherein the one or more beam-scanning optics adjust the separation between the first and second illumination beam distributions to center the first and second illumination beam distributions on the first-direction cell and the second-direction cell of an illuminated one of the two or more cell pairs.

29. The overlay metrology tool of claim 27, further comprising:
a first illumination field stop to define a spatial extent of the first illumination beam distribution; and
a second illumination field stop to define a spatial extent of the second illumination beam distribution, wherein at least one of the first or second illumination field stops is adjustable and synchronized to the one or more beam-scanning optics to provide that the first and second illumination beam distributions are centered in the first and second illumination field stops as the separation between the first and second illumination beam distributions is adjusted.

30. The overlay metrology tool of claim 27, further comprising:
a first collection field stop to define a collection field for the first collection channel; and a second illumination field stop to define a collection field for the second collection channel, wherein at least one of the first or second collection field stops is adjustable and synchronized to the one or more beam-scanning optics to provide that the first and second collection fields are aligned with the first and second illumination beam distributions as the separation between the first and second illumination beam distributions is adjusted.

31. An overlay metrology method comprising:

generating a first illumination beam distribution with a first linear polarization and a second illumination beam distribution with a second linear polarization orthogonal to the first linear polarization;

sequentially illuminating two or more cell pairs of an overlay target on a sample with an illumination system, wherein each of the two or more cell pairs includes a first-direction cell with a grating-over-grating structure having periodicity along a first direction and a second-direction cell with a grating-over-grating structure having periodicity along a second direction orthogonal to the first direction, wherein the illumination system simultaneously illuminates the first-direction cell with the first illumination beam distribution and the second-direction cell with the second illumination beam distribution;

collecting light from the sample as collected light;

directing portions of the collected light associated with first-direction cells of the two or more cell pairs to a first collection channel;

directing portions of the collected light associated with second-direction cells of the two or more cell pairs to a second collection channel;

generating a first overlay measurement along the first direction based on data associated with the first-direction cells of the two or more cell pairs; and generating a second overlay measurement along the second direction based on data associated with the second-direction cells of the two or more cell pairs.

\* \* \* \* \*